United States Patent
Jansson

(10) Patent No.: US 6,831,586 B2
(45) Date of Patent: Dec. 14, 2004

(54) COMPARATOR CIRCUIT AND METHOD OF OPERATING A COMPARATOR CIRCUIT

(75) Inventor: Christer Jansson, Linköping (SE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/683,605

(22) Filed: Oct. 10, 2003

(65) Prior Publication Data

US 2004/0075472 A1 Apr. 22, 2004

Related U.S. Application Data

(63) Continuation of application No. PCT/SE02/00694, filed on Apr. 9, 2002.

(51) Int. Cl.[7] ................................................. H03M 1/34
(52) U.S. Cl. ..................... 341/158; 341/169; 341/170; 341/155
(58) Field of Search ................................ 341/155, 159, 341/169, 172, 63, 80, 103, 158, 170

(56) References Cited

U.S. PATENT DOCUMENTS

| | | | | |
|---|---|---|---|---|
| 4,237,387 A | * | 12/1980 | Devendorf et al. | ......... 327/223 |
| 4,509,036 A | * | 4/1985 | Furihata | ...................... 341/159 |
| 4,814,642 A | * | 3/1989 | Kleks | .......................... 327/159 |
| 5,264,740 A | * | 11/1993 | Wright | ........................ 327/63 |
| 5,291,198 A | * | 3/1994 | Dingwall et al. | ........... 341/159 |
| 5,502,441 A | * | 3/1996 | Swenson | ..................... 341/172 |
| 6,114,882 A | * | 9/2000 | Flynn | .......................... 327/103 |
| 6,225,937 B1 | * | 5/2001 | Butler | ........................ 341/169 |

FOREIGN PATENT DOCUMENTS

| EP | 0 348 999 A2 | 6/1989 | ............ H03M/1/14 |
|---|---|---|---|
| EP | 0 440 356 A2 | 1/1991 | ............ H03M/1/36 |

* cited by examiner

Primary Examiner—Jean Bruner Jeanglaude
(74) Attorney, Agent, or Firm—Baker Botts L.L.P.

(57) ABSTRACT

A comparator for an analog-to-digital converter comprises an input stage ($in_+$, $in_-$, M1, M2) for receiving an input signal; a bipolar latch stage (Q1, Q2; Q1a–b, Q2a–b) coupled to the input stage for performing a latch decision based on the input signal; means for amplifying the latch output ($V_a$, $V_b$) to a level suitable for CMOS circuitry; and an output ($out_+$, $out_-$). The means for amplifying includes at least one tapping transistor (Q3, Q4) coupled to the latch stage for, depending on the latch decision, tapping a collector current ($I_{c2}$; $I_{c1}$) from the latch stage, while leaving the latch decision thereof unaffected, such that a current gain ($\beta$) of the latch stage can be used to amplify a latch bias current ($I_a$, $I_b$) of the latch stage to thereby provide for the amplification.

28 Claims, 7 Drawing Sheets

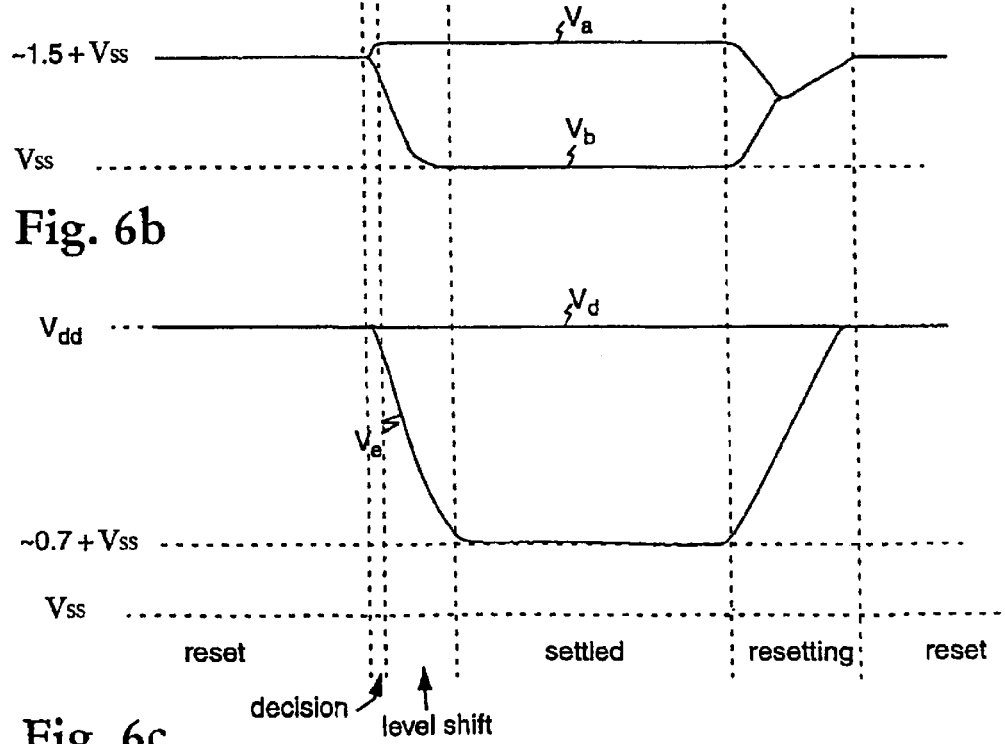

US 6,831,586 B2

COMPARATOR CIRCUIT AND METHOD OF OPERATING A COMPARATOR CIRCUIT

CROSS REFERENCE TO RELATED APPLICATION

This application is a continuation of copending International Application No. PCT/SE02/00694 filed Apr. 9, 2002, and claiming a priority date of Apr. 11, 2001, which designates the United States.

TECHNICAL FIELD OF THE INVENTION

The present invention generally relates to field of analog-to-digital conversion, and more specifically, to a comparator for an analog-to-digital converter, and to a method of operating a comparator circuit.

High speed or low latency analog-to-digital converters (ADC's) need a fast comparator design. In many cases this means that a comparator using a bipolar latch would be advantageous. However, the circuits receiving the comparator output are often implemented in CMOS and hence CMOS output levels of the comparator are desired. Using circuit techniques known today for implementing a level shift from the bipolar latch signal swing of about 0.7 volt to the full power supply signal swing of CMOS with only an insignificant additional delay will require a large power consumption. Such large power consumption can usually not be tolerated or is not desired.

Feeding the 0.7 voltage swing directly to a CMOS buffer will cause two problems to arise. Firstly, the matching of the common mode voltage of the bipolar output to the threshold of the CMOS inverter will depend on absolute values of the different components and will not give a reliable matching. Secondly, the input drive of the CMOS inverter will only be in the order of 0.7/2 volts, which due to the poor MOS transistor transconductance will cause the inverter to only deliver a smaller output current and hence the delay will be undesirably large.

To overcome such problems various comparator circuits have been proposed. In FIG. 1 is shown an example of such a comparator circuit. The FIG. 1 circuit provides CMOS output levels and has the potential of operating at high speed due to the short time constant of the regenerative bipolar latch formed by transistors Q1 and Q2. The nMOS transistors M1 and M2 form an input suitable for switched capacitor circuits. Resistors R1 and R2 comprise a load for the input stage in the preamplification phase when clock Φ is low, and for the bipolar latch during comparison phase starting when Φ goes high. The bipolar latch is buffered by emitter followers Q3 and Q4 to not degrade the regeneration time constant by the load of the differential stage Q5 and Q6, which would slow down the response. The differential stage steers the current $2\times I_3$ to either the current mirror M5, M6 or to the current mirror M7, M8 depending on the latch decision. Consequently, the node voltages $a_+$ and $a_-$ will go in opposite direction to high and low levels depending on the current steering. The desired drive capability is then supplied by buffers B1 and B2.

The comparator in FIG. 1 represents a frequently used technique, wherein the common mode voltage of the bipolar latch output will be of less concern since it is interfaced by the differential stage Q5 and Q6. Also, due to the use of bipolar transistors, even the low ±0.7 volt differential swing will be adequate to fully direct the $2\times I_3$ current. The delay to nodes at is then dependent on the ratio between the parasitic capacitors $C_±$ and the bias current $I_3$, which can be chosen arbitrarily within certain ranges. Thus, an increased speed is obtained at the cost of increased power consumption. The slew rate also improves with low load capacitance, which means that the buffers should have a small input capacitance. Consequently, an increased number of buffer stages may be necessary to provide sufficient drive, but which indeed add further delay to the comparator.

SUMMARY OF THE INVENTION

Accordingly, it is an object of the present invention to provide a comparator circuit for an analog-to-digital converter, which uses a bipolar latch to obtain an adequate speed, and which provides an output suitable to be used in CMOS circuitry.

In this respect there is a particular object of the invention to provide such a comparator circuit, which provides for a fast level shift at an insignificant increase in power consumption.

A further object of the present invention is to provide such a comparator circuit with high drive capability, which reduces the amount of output buffering needed.

Still a further object of the present invention is to provide such a comparator circuit, which is accurate, precise, efficient, simple, and of low cost.

These objects among others are attained by a comparator circuit comprising an input stage, preferably a differential stage, for receiving an input signal; a bipolar latch stage, preferably consisting of a pair of bipolar transistors, coupled to the input stage for performing a latch decision based on the input signal; means for amplifying the latch output to a level suitable for CMOS circuitry; and an output, possibly a differential output. According to the invention the means for amplifying includes at least one and preferably two tapping transistors, preferably bipolar transistors, coupled to the latch stage for, depending on the latch decision, tapping a collector current from the latch stage, while leaving the latch decision thereof unaffected, such that a current gain of the latch stage can be used to amplify a latch bias current of the latch stage to thereby provide for the amplification.

By amplifying the latch bias current to a considerably larger current, which current is used to toggle the state of the output, a higher voltage swing than the swing of the latch stage itself, is provided.

An inventive analog-to-digital converter comprises a plurality of the above described comparator circuit.

Still a further object of the present invention is to provide a method of operating a comparator for an analog-to-digital converter, which provides an output suitable to be used in CMOS circuitry, and which provides for a fast comparison at low power consumption.

These objects among others are attained by a method wherein:

(i) an input signal, preferably a differential signal, is fed to a differential input stage;

(ii) a latch decision is performed based on the input signal in a bipolar latch stage coupled to the input stage, and an output signal, preferably a differential output signal, depending on the decision is output therefrom;

(iii) the output signal is amplified to a level suitable to be input to CMOS circuitry; and (iv) the amplified output signal is output through an output.

The method comprises the inventive features that depending on the latch decision a collector current is tapped from the latch stage, while the latch decision thereof is left unaffected, by means of a tapping or level shift transistor coupled to the bipolar latch stage; and a current gain of said bipolar latch stage is used to amplify a latch bias current of the bipolar latch stage to thereby provide for the amplification of the output signal.

The present invention uses the excessive drive capability of the bipolar latch stage to discharge level shifting nodes located at the output side of the tapping or level shift transistor and thus a large output swing is achieved with low delays and low power consumption. The output swing is readily matched to the full power supply signal swing of CMOS circuitry.

Further characteristics of the invention and advantages thereof will be evident from the detailed description of preferred embodiments of the present invention given hereinafter and the accompanying FIGS. 1–8, which are given by way of illustration only, and thus are not limitative of the present invention.

BRIEF DESCRIPTION OF THE DRAWINGS

Throughout the Figures the following abbreviations are used: Q denotes a bipolar transistor; M denotes a MOS transistor; Φ denotes a clock, R denotes a resistor; C denotes a parasitic capacitance or a capacitor; B denotes a buffer, V denotes a voltage; I denotes a current; INV denotes an inverter, and lower-case letters generally denote various nodes in the respective circuits.

FIG. 2b illustrates a bias generation circuitry to be used with the comparator circuit of FIG. 2a.

FIG. 3a shows clock voltages, FIG. 3b shows voltages at nodes a and b, and FIG. 3c shows voltages at nodes c, d, e and q.

FIGS. 6a–c are diagrams illustrating typical node voltages in the comparator circuit of FIG. 5 during a clock cycle; FIG. 6a shows clock voltages, FIG. 6b shows voltages at nodes a and b, and FIG. 6c shows voltages at nodes d and e.

DETAILED DESCRIPTION OF THE PREFERRED EMBODIMENTS

In the following description, for purposes of explanation and not limitation, specific details are set forth in order to provide a thorough understanding of the present invention. However, it will be apparent to one skilled in the art that the present invention may be practiced in other versions that depart from these specific details.

The present description is divided into ten sections, the first of which briefly overviews the key points of the present invention. Then a first preferred inventive circuit example is presented, followed by three sections regarding a circuit analysis of the first preferred inventive example: analysis in reset phase, analysis in comparison phase, and conclusion. Next, bias considerations for the first circuit example will be given. Thereafter a second preferred inventive circuit example is given, and the following section briefly presents the outlines of a third and a fourth preferred inventive circuit example. Finally, a fifth preferred circuit example is briefly set out followed by a short section of advantages of the present invention.

Key Point of the Invention

The basic idea is to utilize the current gain of the transistors in a bipolar latch to amplify a latch bias current to a considerably larger current, which then is used to toggle the state of a node, which will provide a higher voltage swing than the latch itself. This or these node(s) will hereafter be referred to as level shifting node(s).

The large drive capability will be present when the latch has made its decision and started to toggle. Then one of the two transistors will be turned off so that the whole bias current into that transistor instead will have to go into the base of the other transistor. This means that the collector current of the other transistor will be the bias current (base current) amplified by its current gain, which usually is above 50 times. Additionally, bipolar latches intended for high-speed operation usually have a significant bias level to start with.

To utilize this property the collector current has to be tapped from the latch in such a way that normal latch operation is not disturbed and so that most of the current drive can be used. The tapping of the bipolar latch current can be made in different ways but is preferably implemented using bipolar transistors to fully utilize the bipolar latch drive capability. For best performance the tapped current should be directly lead to the level shifting nodes, which due to the large current levels will evaluate at high speed.

By the use of this feature, very fast comparators can be formed. The biasing of the tapping transistors, hereafter called the level shift transistors if they are directly connected to the level shifting nodes, can be made in various manners by the man skilled in the art.

First Preferred Embodiment (FIGS. 2a–b and 3a–c)

Figure 2A:
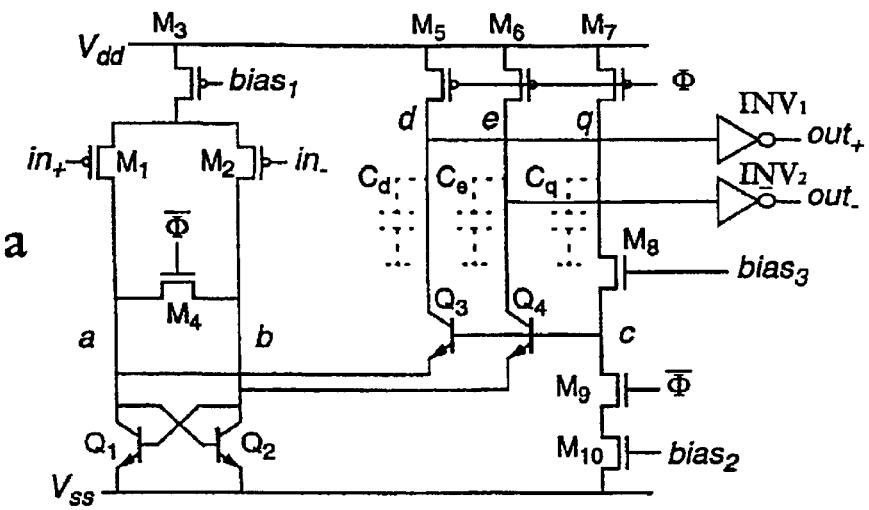
FIG. 2a illustrates a comparator circuit according to a first preferred embodiment of the present invention.
Figure 2B:
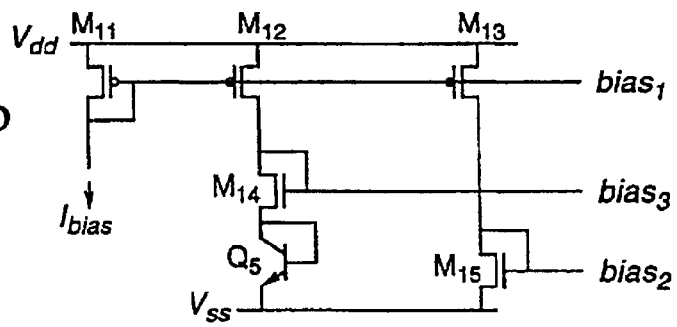

An implementation of the described idea is shown in FIGS. 2a–b, which provides a solution to the speed and power consumption trade-off dilemma of today's comparators. The first part is an ordinary bipolar latch comprising two bipolar transistors Q1 and Q2 with a reset transistor M4 and a differential MOS input stage M1, M2.

The present invention concerns the manner of how the latch decision is converted to CMOS levels. In this embodiment the conversion is primary made by the use of a pair of bipolar transistors Q3 and Q4 in common base configuration. However, a key to make this arrangement reliable and with low power consumption is to provide a proper biasing of the base voltage of transistors Q3 and Q4. MOS transistors M7, M8, M9, M10 and the bias circuit of FIG. 2b supply this biasing, but to rapidly get an understanding of the fundamental operation, the base bias considerations will be left aside for a while.

Figure 3A:
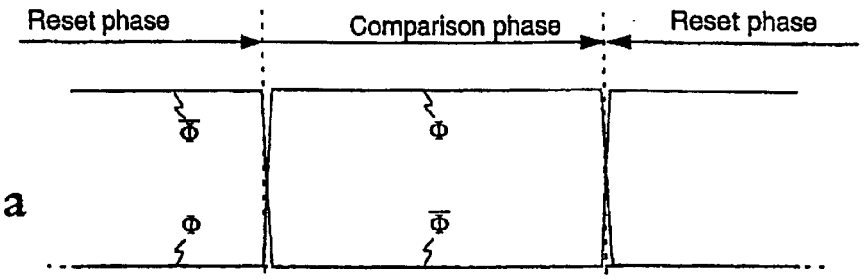
FIGS. 3a–c are diagrams illustrating typical node voltages in the comparator circuit of FIG. 2a during a clock cycle.
Figure 3B:
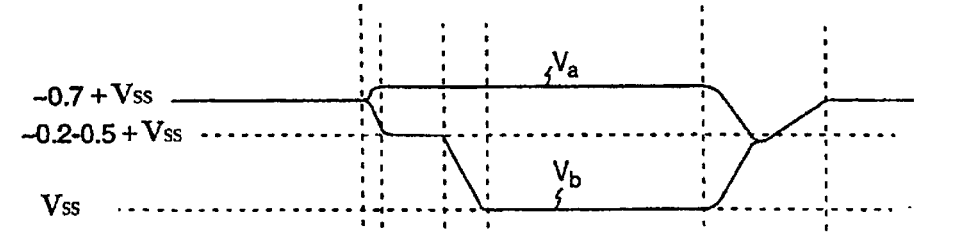
Figure 3C:
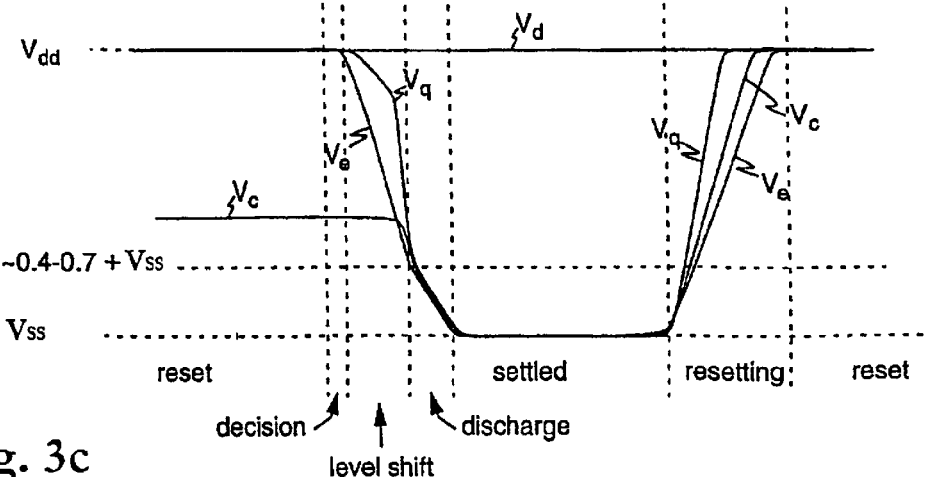

A typical diagram of the node voltages during a cycle of operation for the comparator in FIGS. 2a–b is provided in FIGS. 3a–c. In FIG. 3a is shown the node voltage for clock F; in FIG. 3b are shown $V_a$ and $V_b$, i.e. the voltages at nodes a and b, respectively; and in FIG. 3c are shown $V_c$, $V_d$, $V_e$, and $V_q$, i.e. the voltages at nodes c, d, e, and q, respectively.

A cycle of operation includes reset and comparison phases as indicated at the top of FIG. 3a. Different modes, i.e. reset, decision, level shift, discharge, settled and resetting modes, of operation during reset and comparison phases are indicated at the bottom of FIG. 3c. The following operation description will refer to these modes.

At the beginning of the reset phase the clock signal Φ goes low and consequently transistors M4–M7 are turned on during the initial reset phase (the resetting mode), so that the latch Q1, Q2 is reset and nodes d, e, q become pre-charged.

This pre-charged state is kept during the rest of the reset phase (the reset mode).

Then, at the beginning of the comparison phase the clock signal Φ goes high and transistors M4–M7 will turn off. The latch will then start to evaluate due to imbalance in the currents to the latch from any input voltage (the decision mode).

Depending on the decision, one of the nodes a and b will start to discharge towards $V_{ss}$ (node b in FIG. 3b).

Assuming correct base bias of transistors Q3 and Q4, the transistor connected to the discharging node will turn on and hold this voltage and instead start to discharge the pre-charged node at its collector (the level shift mode).

This discharging is continued (the discharge mode) and finally the node is fully discharged and a steady-state is reached (the settled mode), which complete the operation cycle, see further the section of base bias considerations.

When the pre-charged node has discharged to below the threshold level of the output inverter INV1, INV2 coupled to the node (INV2 coupled to node b via transistor Q4), the comparator output will finally evaluate. This is probably performed during the level shift mode.

As will be seen from the following detailed analysis, the current available to discharge the pre-charged nodes d and e will be very large compared to the bias levels. The analysis will refer to the annotations in FIG. 4, which shows the bipolar latch and the common base transistor circuitry extracted from FIG. 2a.

Figure 4:
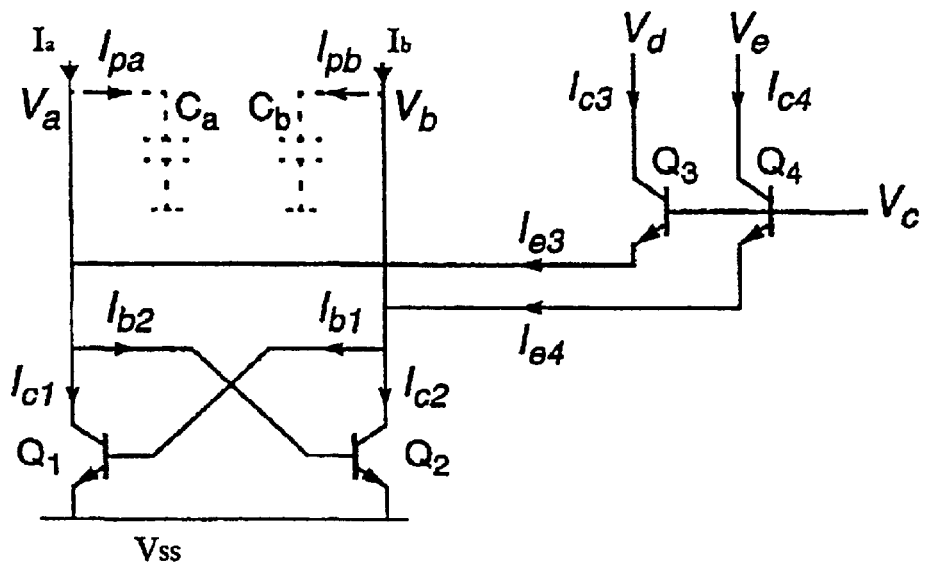
FIG. 4 illustrates the fundamental structure of the comparator circuit of FIG. 2a including a bipolar latch and common base transistor circuitry.

Analysis of the First Preferred Embodiment in Reset Phase (FIG. 4)

At reset phase the a and b node voltages, $V_a$ and $V_b$, respectively, are forced to approximately equal voltages by means of transistor M4. Denote the base-emitter voltage of the bipolar transistors during normal forward biasing as $V_{BEfw}$, which in normal cases is roughly 0.6–0.9 volts. Further, denote the collector-emitter voltage under which the bipolar transistor goes in to saturation and the collector current start to decrease as $V_{CEsat}$. Now assume that the base bias voltage $V_c$ is set at a safe distance from the lower and upper limits so that:

$$V_{BEfw}+V_{CEsat}<V_c<2V_{BEfw} \quad (1)$$

is satisfied at all normal operating conditions. Since transistors Q1 and Q2 together drop the differential stage current, $I_{bias}$, the voltages $V_a$ and $V_b$ will both be near $V_{BEfw}$. The base-emitter voltages of transistors Q3 and Q4 will then become less than $V_{BEfw}$ so that:

$$I_{e3}\approx 0 \text{ and } I_{e4}\approx 0 \quad (2)$$

The level shifting transistors Q3 and Q4 do thus not affect the reset phase except for the additional capacitive load. The capacitive load will, however, be considerably less than the load introduced by the transistors Q1 and Q2 themselves since the base-emitter diodes of transistors Q3 and Q4 are not strongly forward biased.

Analysis of the First Preferred Embodiment in Comparison Phase

During the comparison phase the $I_a$ and $I_b$ currents may be described as:

$$I_a=I_{bias}(\tfrac{1}{2}+\epsilon)$$

$$I_b=I_{bias}(\tfrac{1}{2}-\epsilon), -\tfrac{1}{2}\leq\epsilon\leq\tfrac{1}{2} \quad (3)$$

Since the circuit is symmetric it is sufficient to analyze only the input condition where the latch evaluates so that $V_b$ will drop while $V_a$ slightly rises, i.e. when:

$$\epsilon>0 \quad (4)$$

Due to the exponential I-V relationship of the bipolar base-emitter diode the $V_b$ drop during latch evaluation will rapidly cause transistor Q1 to turn off during the decision mode and soon approach:

$$I_{b1}\approx 0 \quad (5)$$

Defining the bipolar current gain as β this will result in:

$$I_{c1}=\beta I_{b1}\approx 0 \quad (6)$$

Since the strongly forward biased base-emitter diode of the transistor Q2 prevents $V_a$ to rise much further above the initial $V_{BEfw}$ voltage, the charging of $C_a$ will be negligible and thus:

$$I_{pa}\approx 0 \quad (7)$$

so that $$I_{b2}=I_a+I_{e3}-I_{c1}-I_{pa}\approx I_a=I_{bias}(\tfrac{1}{2}+\epsilon) \quad (8)$$

This gives the collector current of transistor Q2:

$$I_{c2}=\beta I_{b2}\approx \beta I_{bias}(\tfrac{1}{2}+\epsilon) \quad (9)$$

Until transistor Q4 turns on the discharge current in $C_b$ will be:

$$I_{pb}=I_b+I_{e4}-I_{c2}-I_{b1}\approx I_b-I_{c2}=I_a\approx I_{bias}(\tfrac{1}{2}-\epsilon)-\beta I_{bias}(\tfrac{1}{2}+\epsilon) \quad (10)$$

At normal conditions: β>>1, and therefore:

$$I_{pb}\approx -\beta I_{bias}(\tfrac{1}{2}+\epsilon) \quad (11)$$

As is understood from eq. (11) the discharge current is large compared to the bias current and the discharge of node b will be rapid as expected from a bipolar latch. When $V_b$ after a short while has discharged down to $V_c-V_{BEfw}$ then transistor Q4 will turn on and start to hold this voltage level at a constant value, which defines the level shift mode. The discharge current is therefore instead deflected via transistor Q4 so that now:

$$I_{pb}\approx 0$$

$$I_{c4}\approx I_{c4}\approx \beta I_{bias}(\tfrac{1}{2}+\epsilon) \quad (12)$$

again assuming a large β. Using the boundaries of ϵ and the condition under which $V_b$ will drop, we get that the discharge current to the level shifting node will be within the range:

$$\beta I_{bias}/2 \leq I_{c4} \leq \beta I_{bias} \quad (13)$$

Conclusion of the Analysis of the First Preferred Embodiment

Figure 1:
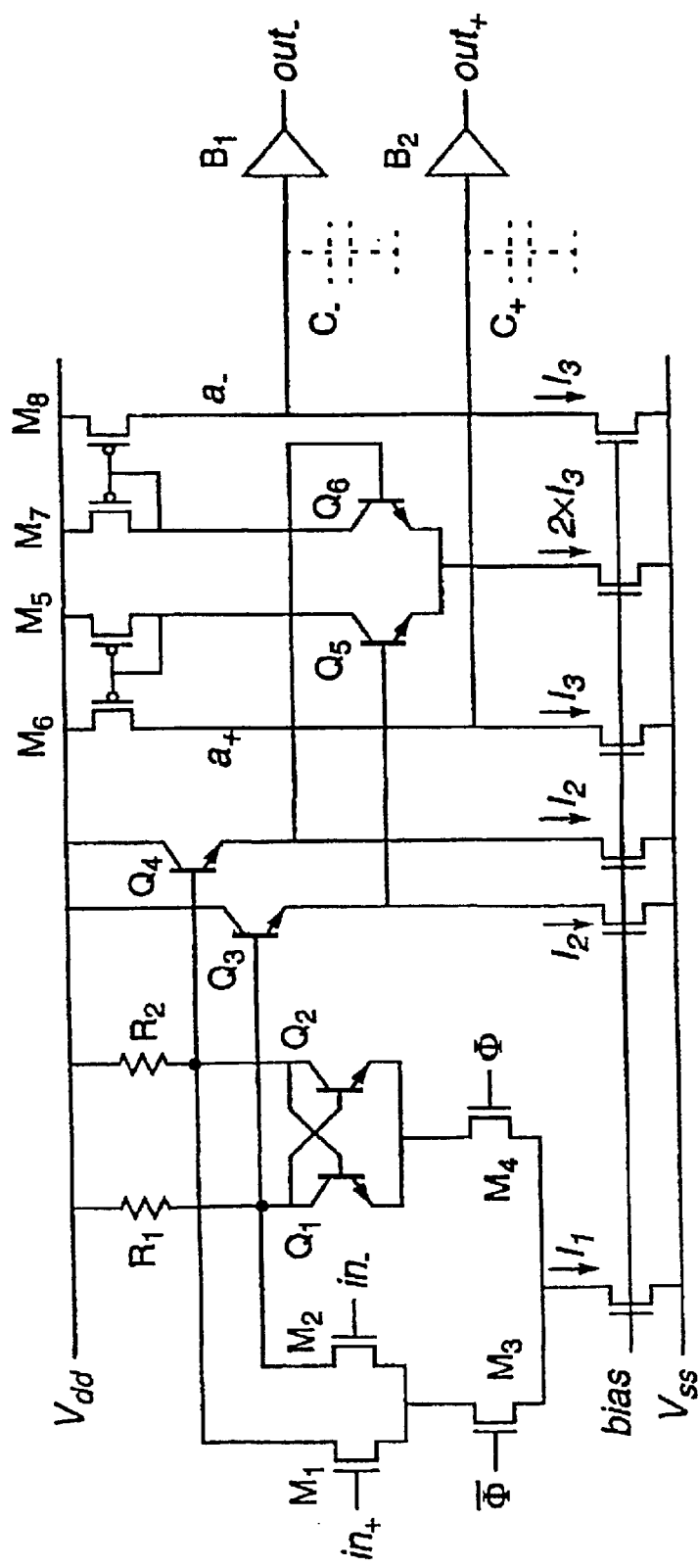
FIG. 1 illustrates a typical prior art comparator circuit.

To get a discharge current in the prior art circuit in FIG. 1, which is comparable to the discharge current indicated by eq. (13) resulting from the proposed technique, the bias current of the second differential stage has to be β times the bias current of the input stage. Usually, β is above 50 and hence considerably power consumption savings or performance improvements can be made using the suggested approach. This holds especially true when the demands for a short delay in the level shifting stage is stringent.

Also, since the discharge current is of that magnitude, the need of a low load capacitance is considerably reduced. Therefore the output buffer can in most cases be reduced to a single inverter and hence the delays of extra buffer stages are avoided.

Base Bias Considerations

When the level shifting node has been discharged so that the level shift transistor goes into saturation, the voltage $V_c$ should no longer be held constant since the latch would in such cases continue to drive the large current but now via the level shift transistor base. This current would then have to be supplied by the power supply resulting in unnecessary power consumption.

To allow $V_c$ to drop when either $V_d$ or $V_e$ has been discharged a MOS transistor M8 arranged in a source follower configuration is used to regulate the $V_c$ voltage. Its drain is connected to another pre-charged node q and therefore, when node d or e has been discharged the current flow will instead start to discharge node q via the level shift transistor base and transistor M8, which defines the discharge mode.

The need of charge storage capacity at node q is only 1/β times the charge storage capacity at nodes d or e due to the current gain in the level shift transistors. This is easily accomplished by the small parasitic capacitors inherent to transistor M8 and its pre-charge transistor M7. The node q will therefore rapidly be discharged and transistor M8 will no longer be able to hold the $V_c$ voltage, so this voltage will now drop. When $V_b$ approaches $V_{ss}$ the current flow ceases and unnecessary power consumption is avoided. The comparator is now fully settled (settled mode) since its output is already evaluated at this stage.

The power consumption of the level shift operation will not appear until the reset phase starts since no extra current will be drawn from the supply during the comparison phase because transistors M5–M7 are off. At the first moments of the reset phase, nodes d, e and q will be pre-charged again and the small charge from the power supply to pre-charge these nodes is the only power consumption cost that will be required for the level shift operation besides the minor bias current in transistor M10 during the reset phase. The bias current of transistor M10 is only needed to keep the $V_c$ voltage difference between reset and comparison phase negligible by drawing at least a minor current in transistor M8 during the two phases. Otherwise there will be a mismatch since a level shift transistor will draw base current through transistor M8 in the comparison phase but not in the reset phase. Transistor M10 is switched of in the comparison phase by transistor M9. The current compensation of transistors M9–M10 is not compulsory.

The choice of $V_c$ level deserves some comments. The closer $V_c$ is to the upper voltage limit, the faster the comparator response will be since the latch does not have to toggle as much before the level shifting transistors turn on. But if $V_c$ would equal or go above the upper limit there will be a large static current during the reset phase increasing the power consumption to start with, and beyond that, the comparator will fail to work primarily due to that the nodes d and e newer will pre-charge to high. On the other hand, if $V_c$ goes below the lower voltage limit, the comparator will rapidly get slower as the latch transistors saturates when trying to supply current to the level shift transistors. Eventually, the level shift transistors will not turn on at all and the circuit fails to work. Simulations has shown a useful range of at least 0.6 volt for the $V_c$, which should be easy to maintain for example by using the bias circuit arrangement in FIG. 2b assuming that the transistor ratios are correctly adjusted.

Second Preferred Embodiment (FIGS. 5 and 6a–c)

Figure 5:
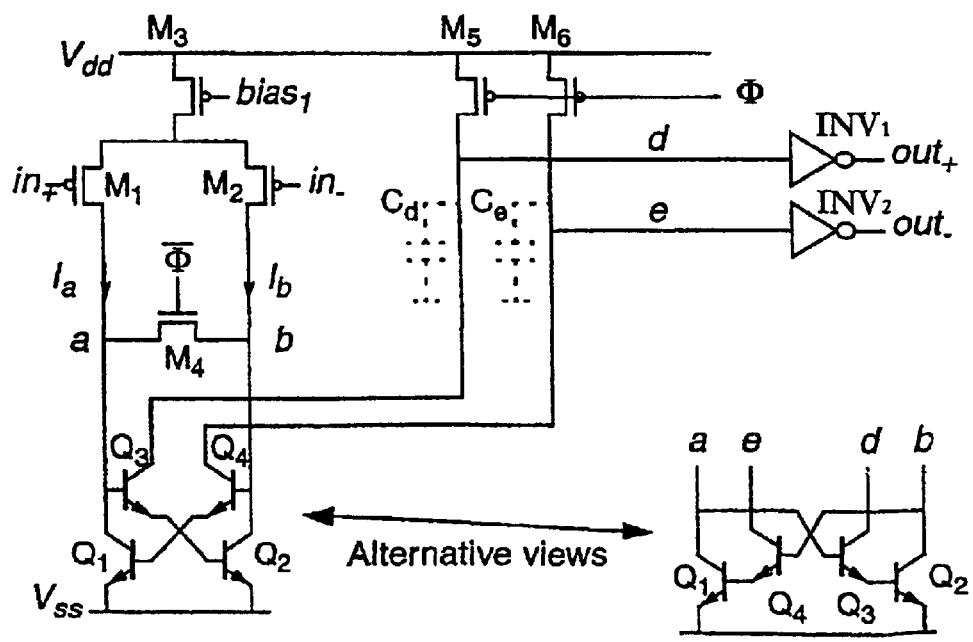
FIG. 5 illustrates a comparator circuit according to a second preferred embodiment of the present invention.

Another circuit example making use of the suggested principle is shown in FIG. 5. By a quick look at this circuit we can see that in the reset phase and prior to a valid decision, the discharge current to d and e is only the small base currents of transistors Q1 and Q2. As soon as a decision is made either Q1 or Q2 will turn off so that the corresponding level shift transistor Q3 or Q4 will get the whole $I_a$ or $I_b$ current into its base. This current will be amplified by the transistor current gain and thus the level shift current will, as for the first circuit example, be rather large.

However, this circuit cannot discharge a level shift voltage lower than $V_{BEfw}$ since the discharge paths are in series with the forward base-emitter diodes of either transistor Q1 or transistor Q2. In contrast thereto, the first circuit example will discharge to a voltage close to $V_{ss}$ even though the discharge rate of the last tenth of volts will be slow. Simulations also shows that this second comparator is slower. But instead, the need of extra bias arrangements are completely eliminated.

Clock pulse voltages and node voltages at nodes a, b, d and e during an operation cycle of this comparator circuit embodiment are shown in FIGS. 6a–c. As before the reset and comparison phases are indicated at the top of FIG. 6a, whereas the reset, decision, level shift, discharge, settled and resetting modes are indicated at the bottom of FIG. 6c.

Figure 7A:
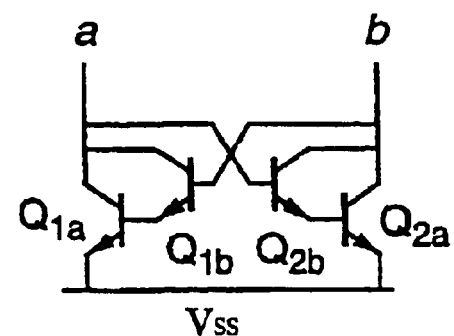
FIGS. 7a–b illustrate schematically a respective latch configuration with current gain equal to the square of the transistor current gain to be used in a comparator circuit according to a respective third and fourth preferred embodiment of the present invention.
Figure 7B:
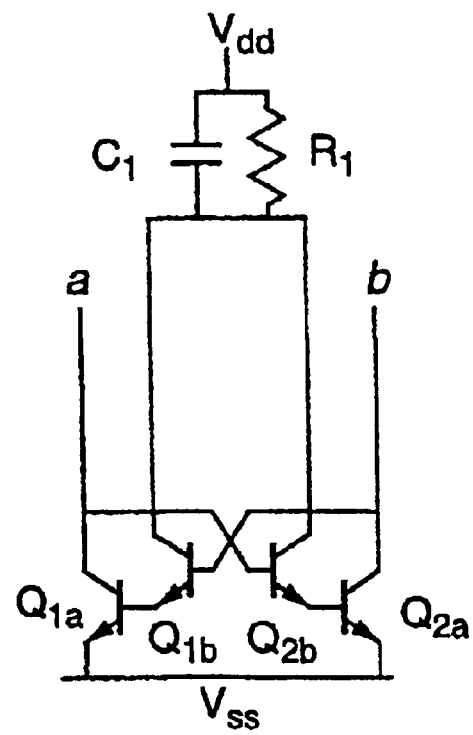

Third and Fourth Preferred Embodiments (FIGS. 7a–b)

The use of Darlington-like coupled transistors in the latch stage opens up for a few alternative configurations.

According to a third preferred embodiment circuit of the present invention the comparator comprises a latch including four bipolar transistors Q1a, Q1b, Q2a, Q2b arranged in a Darlington-coupled state as shown in FIG. 7a. As regards other components and features this embodiment does not differ from the first preferred embodiment of the invention illustrated in FIG. 2a.

The effective current gain will increase to $\beta_2$ using this third embodiment, which results in a considerably higher current drive capability. The bias3voltage (see FIG. 2a) now has to be about 0.7 volt higher due to one additional forward biased diode voltage drop in the latch. Also the d and e node voltages will only drop to about 0.7 volt due to this additional diode voltage drop.

Next, according to a fourth preferred embodiment circuit of the present invention the comparator comprises a latch including four bipolar transistors Q1a, Q1b, Q2a, Q2b arranged in a Darlington-like coupled state. The collectors of transistors Q1b and Q2b are as indicated in FIG. 7b connected to $V_{dd}$ via RC circuitry $R_1$, $C_1$, and the emitters of transistors $Q1_a$ and $Q2_a$ are connected to $V_{SS}$. Nodes a and b are as before coupled to a differential input stage. As regards other components and features this embodiment does not differ from the first preferred embodiment of the invention illustrated in FIG. 2a.

Using such a comparator design the high current gain advantage of the Darlington transistors is obtained, while still having a current drive down to the low $V_{ss}$ potential.

This comparator design also makes the biasing network of the tapping transistors as shown in FIG. 2b less critical since the latch voltage swing will be equal to two diode junction voltages or about 1.4 volts. The resistor $R_1$ shall have a value low enough to provide adequate bias to transistors Q1a and Q1b and discharge of capacitor $C_1$ during reset phase, but also have a resistance high enough to limit static power consumption during comparison phase. The function of $C_1$ is to temporarily maintain a high collector voltage of transistors Q1a and Q1b during the level shifting to get full current amplification in transistors Q1a and Q1b. The value of $C_1$ has to be large enough to keep transistors Q1a and Q1b active until the level shift nodes have evaluated.

Figure 8:
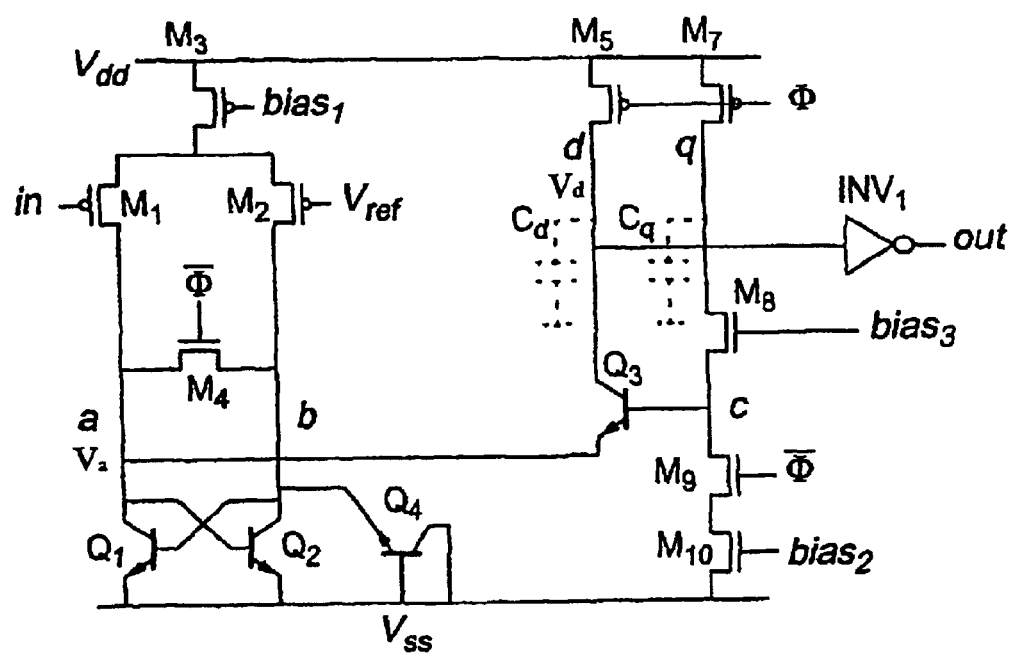
FIG. 8 illustrates a comparator circuit according to a fifth preferred embodiment of the present invention.

Fifth Preferred Embodiment (FIG. 8)

In applications that require only a single-ended comparator output it is possible to omit some of the comparator components compared to the embodiments using differential signals. An example hereof is illustrated in FIG. 8, which is a single-ended embodiment version corresponding to the comparator of FIGS. 2a–b. In FIG. 8 the negative input is replaced by a reference voltage input leaving only a single-ended input. The purpose of the Q4 transistor is only to add the same amount of parasitic capacitance as tapping transistor Q3 adds, so that the parasitic capacitance on nodes a and b are matched. This will minimize systematic offsets but Q4 can be removed if such offsets are not important.

Advantages of the Present Invention

The invention will improve the delay and power consumption product of most comparators whenever a BiCMOS process is available and CMOS output levels, i.e. levels corresponding to the full power supply signal swing of CMOS circuitry, are needed. Such comparators are widely used in high performance A/D-converters and are in many cases limiting factors in system performance. Therefore the present invention will raise the performance of such systems and fulfil strict requirements as regards both speed and power consumption.

What is claimed is:

1. A comparator for an analog-to-digital converter comprising:
    an input for receiving an input signal;
    a bipolar latch stage coupled to the input for performing a latch decision based on said input signal and for outputting an output signal depending on said decision;
    a reset switch coupled to said bipolar latch stage for resetting said latch stage subsequent to said latch decision;
    amplification means coupled to the latch stage for amplifying said output signal so that said amplified output signal is suitable to be input to CMOS circuitry, wherein said amplification means includes:
        a first tapping or level shift transistor coupled to said bipolar latch stage for, depending on the latch decision, tapping a collector current from said latch stage, while leaving the latch decision thereof unaffected, so that a current gain of said bipolar latch stage can be used to amplify a latch bias current of said bipolar latch stage to thereby provide for the amplification of said output signal.

2. The comparator as claimed in claim 1 wherein said input includes a pair of differential inputs, and wherein said input signal is a differential input signal.

3. The comparator as claimed in claim 2 wherein said output signal is a differential output signal, and wherein said amplification means includes a second tapping or level shift transistor coupled to said bipolar latch stage for, depending on the latch decision, tapping a collector current from said latch stage, while leaving the latch decision thereof unaffected, such that a current gain of said bipolar latch stage can be used to amplify a latch bias current of said bipolar latch stage to thereby provide for the amplification of said differential output signal.

4. The comparator as claimed in claim 3 wherein said pair of tapping or level shift transistors are bipolar transistors.

5. The comparator as claimed in claim 3 wherein said bipolar latch stage includes a pair of bipolar transistors, the base of each of which is coupled to the emitter of a respective one of said tapping or level shift transistors.

6. The comparator as claimed in claim 5 wherein said comparator is adapted to turn off one of said bipolar latch transistors subsequent to said latch decision to thereby switch a bias current fed into said one bipolar latch transistor to the base of the other one of said bipolar latch transistors, whereby a collector current of said other one of said bipolar latch transistors will be considerably increased.

7. The comparator as claimed in claim 3 wherein said comparator is adapted to directly lead said tapped collector current from said latch stage via one of said tapping or level shift transistors to one of said differential outputs.

8. The comparator as claimed in claim 3 wherein each of said differential outputs is coupled to an inverter.

9. The comparator as claimed in claim 3 wherein said comparator is implemented in BiCMOS technology.

10. The comparator as claimed in claim 3 wherein the bipolar latch stage comprises a first and a second bipolar transistor arranged in a cross-coupled state, so that
    the collector of the first transistor is connected to the base of the second transistor, which connection defines a first node; and
    the collector of the second transistor is connected to the base of the first transistor, which connection defines a second node; and wherein
        the emitters of the first and second transistors are connected to a common electrical potential.

11. The comparator as claimed in claim 10 wherein said pair of differential inputs are connected, via said input stage, to said first and second nodes, respectively.

12. The comparator as claimed in claim 10 wherein
    a first one of said pair of tapping or level shift transistors is connected so that the emitter thereof is connected to said first node, and the collector thereof is connected, via a third node, to a first one of said pair of differential outputs; and
    a second one of said pair of tapping or level shift transistors is connected so that the emitter thereof is connected to said second node, and the collector thereof is connected, via a fourth node, to a second one of said pair of differential outputs; and wherein the bases of said pair of tapping or level shift transistors are connected.

13. The comparator as claimed in claim 12 further comprising a bias circuitry for biasing of the base voltage of said pair of tapping or level shift transistors.

14. The comparator as claimed in claim 3 wherein the bipolar latch stage comprises a first and a second bipolar transistor arranged so that
the collector of the first transistor is connected to the base of a first one of said pair of tapping or level shift transistors, which connection defines a first node;
the collector of the second transistor of the bipolar latch stage is connected to the base of a second one of said pair of tapping or level shift transistors, which connection defines a second node;
the base of the first transistor is connected to the emitter of the second one of said pair of tapping or level shift transistors;
the base of the second transistor of the bipolar latch stage is connected to the emitter of the first one of said pair of tapping or level shift transistors; and
the emitters of the first and second transistors are connected to a common electrical potential.

15. The comparator as claimed in claim 14 wherein said pair of differential inputs are, via said input stage, connected to said first and second nodes, respectively.

16. The comparator as claimed in claim 14 wherein
the collector of said first one of said pair of tapping or level shift transistors is connected, via a third node, to a first one of said pair of differential outputs; and
the collector of said second one of said pair of tapping or level shift transistors is connected, via a fourth node, to a second one of said pair of differential outputs.

17. The comparator as claimed in claim 1 wherein said bipolar latch stage comprises four bipolar transistors in a Darlington-coupled state.

18. The comparator as claimed in claim 3 wherein
said bipolar latch stage comprises four bipolar transistors, wherein
the collector of a first one of said four bipolar transistors is connected to the base of a second one of said four bipolar transistors, which connection is further connected to the emitter of a first one of said pair of tapping or level shift transistors;
the collector of a third one of said four bipolar transistors is connected to the base of a fourth one of said four bipolar transistors, which connection is further connected to the emitter of a second one of said pair of tapping or level shift transistors; and
the collectors of said second and forth ones of said four bipolar transistors are connected to a voltage supply via an RC circuitry.

19. The comparator as claimed in claim 1 further comprising an input stage coupled to the input for receiving said input signal as a signal suitable for switched capacitor circuits.

20. The comparator as claimed in claim 19 wherein said input stage is adapted to supply said latch stage with bias current.

21. The comparator as claimed in claim 1 further comprising a clock for controlling said reset switch.

22. An analog-to-digital converter comprising a plurality of comparators wherein each comparator comprises:
an input for receiving an input signal;
a bipolar latch stage coupled to the input for performing a latch decision based on said input signal and for outputting an output signal depending on said decision;
a reset switch coupled to said bipolar latch stage for resetting said latch stage subsequent to said latch decision;
amplification means coupled to the latch stage for amplifying said output signal so that said amplified output signal is suitable to be input to CMOS circuitry, wherein said amplification means includes:
a first tapping or level shift transistor coupled to said bipolar latch stage for, depending on the latch decision, tapping a collector current from said latch stage, while leaving the latch decision thereof unaffected, so that a current gain of said bipolar latch stage can be used to amplify a latch bias current of said bipolar latch stage to thereby provide for the amplification of said output signal.

23. A method of operating a comparator for an analog-to-digital converter comprising the steps of:
feeding an input signal to an input;
performing a latch decision based on said input signal and outputting an output signal depending on said decision by means of a bipolar latch stage coupled to the input;
resetting said latch stage subsequent to said latch decision by means of a reset switch coupled to said bipolar latch stage;
amplifying said output signal, so that said amplified output signal is suitable to be input to CMOS circuitry; and
outputting said output signal suitable to be input to CMOS circuitry, said method being further comprising the steps of:
depending on said latch decision tapping a collector current from said latch stage, while leaving the latch decision thereof unaffected, by means of a tapping or level shift transistor coupled to said bipolar latch stage; and
using a current gain of said bipolar latch stage to amplify a latch bias current of said bipolar latch stage to thereby provide for the amplification of said output signal.

24. The method as claimed in claim 23 wherein said fed input signal is a differential input signal and said input includes a pair of differential inputs.

25. The method as claimed in claim 24 wherein said output signal is a differential output signal, and wherein, depending on said latch decision, a collector current is tapped from said latch stage by means of a second tapping or level shift transistor coupled to said bipolar latch stage, while leaving the latch decision thereof unaffected, so that a current gain of said bipolar latch stage can be used to amplify a latch bias current of said bipolar latch stage to thereby provide for the amplification of said differential output signal.

26. The method as claimed in claim 25 wherein
said bipolar latch stage includes a pair of bipolar transistors; and wherein
one of said bipolar latch transistors is turned off subsequent to said latch decision to thereby switch a bias current fed into said one bipolar latch transistor to the base of the other one of said bipolar latch transistors, whereby a collector current of said other one of said bipolar latch transistors will be considerably increased.

27. The method as claimed in claim 26 wherein said considerably increased collector current is directly lead from said other one of said bipolar latch transistors via one of said tapping or level shift transistors to one of said differential outputs.

28. A method of operating an analog-to-digital converter comprising the step of operating a plurality of comparators, wherein the operation of each comparator comprises the steps of:

feeding an input signal to an input;

performing a latch decision based on said input signal and outputting an output signal depending on said decision by means of a bipolar latch stage coupled to the input;

resetting said latch stage subsequent to said latch decision by means of a reset switch coupled to said bipolar latch stage;

amplifying said output signal, so that said amplified output signal is suitable to be input to CMOS circuitry; and outputting said output signal suitable to be input to CMOS circuitry, said method being further comprising the steps of:

depending on said latch decision tapping a collector current from said latch stage, while leaving the latch decision thereof unaffected, by means of a tapping or level shift transistor coupled to said bipolar latch stage; and using a current gain of said bipolar latch stage to amplify a latch bias current of said bipolar latch stage to thereby provide for the amplification of said output signal.

* * * * *